United States Patent [19]

Lenz

[11] 4,396,887
[45] Aug. 2, 1983

[54] MAGNETIC DISK-MEMORY-CARTRIDGE HUB TESTER

[75] Inventor: Charles E. Lenz, Omaha, Nebr.

[73] Assignee: Magnetic Peripherals Inc., Minneapolis, Minn.

[21] Appl. No.: 180,279

[22] Filed: Aug. 22, 1980

[51] Int. Cl.³ ............................................. G01R 33/00
[52] U.S. Cl. ................................................... 324/262
[58] Field of Search .............. 324/205, 228, 224, 262; 73/862.53

[56] References Cited

U.S. PATENT DOCUMENTS 4,056,770 11/1977 Mohr et al. .......................... 324/205

FOREIGN PATENT DOCUMENTS 594486 2/1978 U.S.S.R. .............................. 324/205

Primary Examiner—Gerard R. Strecker
Assistant Examiner—Walter E. Snow
Attorney, Agent, or Firm—William J. McGinnis; Joseph A. Genovese

[57] ABSTRACT

A magnetic tester for hubs employed in disk-memory cartridges is provided to measure the mounting strength of hub armatures, the gross magnetic hub-retaining force, the hub-diaphragm preload strength, the net hub-retaining force, the variation of hub preload with diaphragm deflection, and the variation of hub-retaining force with magnetomotive force. The hub tester includes magnetic pole pieces positioned to accurately simulate the nonlinear flux distribution in a hub armature, an adjustable electromagnet to permit accurate determination of the size of the permanent spindle magnet required in an operative associated disk drive to obtain a given retaining force, an adjustable spindle convertible to accommodate different hub types, means for adjusting diaphragm deflection to vary the preloading force, a pneumatically equalized proof ring that applies symmetrical accurately oriented tensile force to the hub-armature interface, and means for automatic pneumatic and mechanical damping to prevent contingent damage in the event of test-piece failure.

18 Claims, 1 Drawing Figure

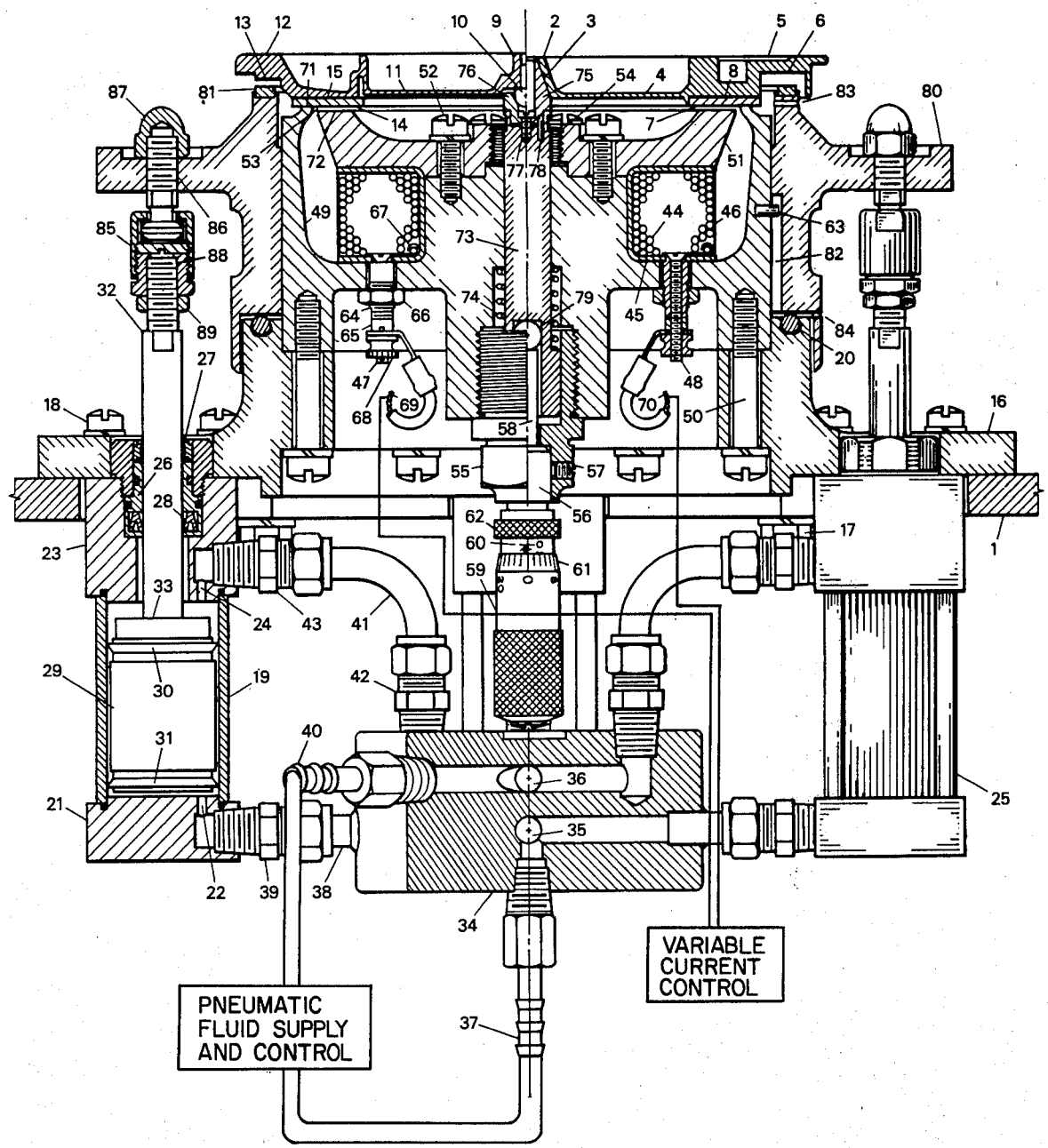

MAGNETIC DISK-MEMORY-CARTRIDGE HUB TESTER

BACKGROUND OF THE INVENTION

This invention relates to memory-disk drives as used in computer systems. Such disk drives utilize a memory-disk cartridge which is separate from and removable from the memory-disk drive. The memory-disk drive has a spindle on which the rotating memory-disk element is mounted by means of a mounting hub magnetically retained by an attached armature. More specifically, this invention relates to a testing device for such memory-disk-cartridge hubs to aid in both the design process and the testing of completed units. The hub tester works by providing variable mechanisms to simulate the conditions of mounting on an actual memory-disk drive spindle.

There is relatively little prior art relating to this type of specialized equipment. However, earlier testing devices did not provide for variation in magnetic field strength to test a full range of resultant retaining forces. Similarly, the prior art did not provide an authentic reproduction of the hub-diaphragm action in testing magneticaly retained disk-cartridge hubs. Other features not present in the prior art but present in the disclosed invention relate to stress testing and determination of failure modes of the device under test. A further requirement of testing is that the unit be capable of testing different hub-assembly designs and that this be the result of a fairly simple and rapid testing procedure. Further requirements of such a testing device would be high reliability as to measurement results, accuracy, and repeatability. It is believed that the present invention fulfills the various requirements for hub testing in a single unit in a way not previously obtainable except as the result of using several different testing devices for separate tests.

One significant problem with the prior art is that the stress distribution magnetically applied to the hub armature did not closely resemble that existing during actual hub operation. Consequently, even though a hub assembly might withstand the total force considered necessary in an appropriate specification, there was no assurance that the peak tensile stress existing between the armature and attached hub during actual operation had been reached during a test cycle. Consequently, test results were inconclusive in some situations. A specific example of a problem with the prior art is illustrated by a test in which an armature withstood a standard proof test of 400 pounds but subsequently failed during a final-assembly operation under a tensile force no greater than 40 pounds. Obviously such a test is misleading, and the present invention is directed towards a hub tester which provides meaningful test results.

SUMMARY OF THE INVENTION

The present invention is a magnetic disk-cartridge hub tester designed in general to test the mechanical integrity and functioning of a data-storage-cartridge hub assembly. The hub assembly of such a cartridge typically incorporates a nonmagnetic hub consisting of a integral central collar to control positioning in the disk drive. Such a hub further includes a diaphragm, a concentric rim providing a surface on which axial lifting force may be applied for testing purposes, and a magnetically soft armature attached to the rim. The flexible diaphragm connects the rim and collar in a manner which permits limited axial displacement.

The invention incorporates a base assembly consisting of a circular base and a multiplicity of vertical cylinder assemblies which are pneumatically actuated. Each cylinder assembly would preferably be of the double-acting type without a return spring. A manifold assembly is coupled to the base assembly and applies equal predetermined pressures to all of the vertical cylinder assemblies to accomplish stress-testing functions. An electromagnet assembly is also coupled with the base assembly and functions primarily to attract and retain the magnetically soft armature of the hub under test by causing an appropriate magnetic field to traverse the armature. The hub tester according to the present invention further includes a spindle assembly coupled to the base assembly and coaxial with the electromagnet assembly to accommodate the collar portion of the hub under test. Finally, a proof-ring assembly is coupled with the electromagnet assembly to slide axially in the direction of the spindle along the pole piece of the electromagnet assembly. The function of the proof-ring assembly is to convert the concentrated forces applied by the cylinder-assembly piston rods into a continuous, uniformly distributed force to be applied to the outer edge of a hub under test.

IN THE SINGLE DRAWING FIGURE

The single drawing FIGURE shows a hub tester according to the present invention with sectors of two different configurations of cartridge hubs on either side of the center line of the drawing, respectively, in an operative position.

IN THE PREFERRED EMBODIMENT

The present invention is a magnetic disk-memory-cartridge hub tester for hubs adapted to be used with magnetic disk drives in computer systems. The hub assembly of a typical disk cartridge consists of a flat annular armature disk of a magnetically soft metal concentrically mounted on a circular nonmagnetic metal hub by bonding, molding, or bolting. An appropriate magnetically soft metal might be cold-rolled steel. Specifically, the hub tester as described herein may be embodied in a form suitable for testing the hub assemblies of Control Data Corporation Model 846, 847, 848, and 1204 disk cartridges, which are of this construction. Typical specifications for such cartridges state that test-acceptance requirements for a hub assembly are that the armature plate shall withstand a total force that substantially exceeds the gross magnetic force applied during actual operation with no permanent armature-plate distortion and no detectable separation of the armature plate from the hub. The gross magnetic force found in normal operation may be on the order of 35 pounds with a margin of five pounds in either direction. Such distortion or separation of the armature plate from the hub in operation can have dangerous consequences including personnel injury, loss of stored data, and equipment damage.

The general purpose of a hub tester according to this invention is to test the attachment of a disk-cartridge armature of any appropriate type to be associated hub by producing accurately adjustable tensile stress between the hub and armature while the armature is retained by a magnetic field whose distribution closely approximates that encountered in actual operation. A hub assembly can thus be tested in a variety of ways; for example, under actual operating conditions, with a specified safety factor, or in some cases to destruction of the unit.

More specifically, in the invention a hub assembly is accurately positioned by means of a spindle adapter of appropriate shape and of precisely adjustable height to permit duplicating the stress distribution resulting from diaphragm deflection in a cartridge. This deflection may typically be 0.008 in h for an applied force of approximately 15 pounds. One useful purpose of the invention is to achieve these results by means readily adaptable to a variety of hub-assembly designs. One desired function of the present hub tester is to retain the hub assembly in position by means of an automatically controllable, electromagnetically generated stress field distributed to closely resemble that existing in an actual hub armature in operation but variable in amplitude from near zero to several times the operating flux density. One further testing function it to subject the constrained hub assembly to an axially oriented, symmetrically distributed tensile force variable from less than a specified operating value—which may be 35 pounds, for example—to several times that value by means of an automatically controllable, pneumatically equalized proof ring. An additional purpose of the testing process is to fully disengage the proof ring at the conclusion of a test cycle by automatically controllable means so that it no longer exerts any effect whatever on the hub assembly under test. A further test is that of measuring the force exerted by known diaphragm deflection. Finally, an important object of the testing mechanism of this present invention is to prevent injury to either the operator or the equipment if the hub under test should fail in any fashion.

Referring now to the single drawing FIGURE, a cross-sectional representation of a hub tester according to the present invention is shown mounted on a mounting platform or plate 1. Sectors of two different cartridge hub assemblies are illustrated along either side of the center line of the FIGURE at the top to show application to different structures. The hub assembly typically includes a nonmagnetic hub consisting of an integral central collar 2 permitting a means for accurate radial and axial positioning such as the internal taper shown at reference numeral 3, a hub diaphragm 4, and a concentric rim 5 providing a surface 6 to which axial lifting force may be applied for testing. An armature 7 of magnetically soft material is attached by a bonding agent 8 to rim 5; alternatively, any other appropriate means of attachment may be used between the armature 7 and the rim 5, including bolting or molding. During testing a predetermined, axially directed, symmetrically distributed tensile force is applied between rim 5 and armature 7. The invention may be adapted to numerous different hub assemblies having a compatible design such as that illustrated in the other section of the drawing FIGURE by the combination of a collar 9 retaining as a positioning means ball stud 10 of a diaphragm 11 having a concentric rim 12 to provide a lifting surface 13. As before, an armature 14 is shown attached rigidly to rim 12 by a bonding agent 15. The primary features of such hub assemblies are all similar. The rim additionally retains the associated data-storage disk or disks and provides angular indexing. The magnetic armature retains the hub assembly on the disk drive or, alternatively, retains the bottom cover during storage. The flexible diaphragm connects the associated rim and collar in a manner that permits limited axial displacement.

A hub tester according to the present invention includes a base assembly having a circular base or base support member 16 rigidly attached by appropriate means such as fasteners 17 and 18, respectively, to the horizontal mounting plate 1 and to a multiplicity of vertical cylinder assemblies—typically four—equally spaced around the center of the device in a circular fashion. Each vertical cylinder assembly is characterized by the barrel 19 shown in the FIGURE. A shock ring 20 of elastic material is embedded in the top of base support member 16. The base assembly functions to retain other elements of the invention in the proper mechanical relationship both to each other and to the mounting plate 1 and to provide an upward or downward reaction for actuating other elements of the invention. The mounting of flexible shock ring 20 resists downward impact by other elements of the invention in a manner to reduce excessive noise or shock. For discussion purposes each cylinder assembly can be assumed to be pneumatically actuated, although other appropriate means including hydraulic means may also be employed. More generally, a vertically actuated motor means operates from the base support member 16 to drive the proof ring 80, which will be discussed in greater detail below.

In a typical case, shown in the FIGURE, cylinder barrel 19 is sealed by a lower cylinder head 21 having a port 22 and by an upper cylinder head 23 having a port 24. Contiguous cylinder heads and barrels are rigidly assembled by a multiplicity of tie rods 25. The upper cylinder heads 23 are traversed by piston-rod bushing 26 and have cascaded piston-rod seals 27 and 28.

An associated piston subassembly consists of a piston 29, piston seals 30 and 31, and piston rod 32, all rigidly connected together but sliding freely vertically in barrel 19 both through rod bushing 26 and in rod seals 27 and 28. Piston seals 30 and 31 prevent air or any other operative fluid from flowing past the piston in either direction, while rod seals 27 and 28 prevent the unwanted escape of air or any other operative fluid from above the piston assembly. A vertical force is thus exerted on a piston assembly whenever the pressure-area product for the upper surface differs from that of the lower surface. An elastic shock pad 33 may be mounted on the upper surface of each piston assembly to prevent excessive noise and damaging shock due to unrestrained upward piston motion.

It is significant that each cylinder assembly is of the double-acting type without a return spring; that is, each piston rod exerts upward or downward force only in response to the relative gauge pressures at the two associated ports. This feature permits accurate control of vertical piston-rod force independently of the spring force variation that would otherwise occur unavoidably with piston position and possibly with repeated use. Thus in the present embodiment, piston-rod force can be controlled precisely by controlling the difference in air pressure between the upper and lower ports to eliminate a force-gauge mechanism.

A manifold assembly consists of a dual manifold 34 having isolated lift and retract plenums 35 and 36, respectively, a lift hose coupling 37 connected to each lower cylinder port by a lift-runner means such as tube 38 extending between manifold 34 and the associated connector 39, and a retract hose coupling 40 connected to each upper cylinder port by a retract runner such as a tube 41 extending between the associated connectors 42 and 43. The manifold assembly functions alternately to apply equal predetermined gauge pressure beneath each piston while allowing the gauge pressure above each piston to decrease to zero and to apply equal predetermined gauge pressure above each piston while allowing the gauge pressure beneath each piston to decrease to zero.

An electromagnet assembly consists principally of several rigidly connected components. A coil 44 of insulated conductive wire is wound on an insulating spool 45 and protected by a covering 46. The terminals 47 and 48 of the coil are provided for external connection. The magnet has a cylindrical outer pole piece 49 of a magnetically soft material rigidly secured to the base support member 16 by fasteners 50 and partially surrounding the coil 44. A concentric inner pole piece 51, also constructed of a magnetically soft material, is secured to the outer pole piece 49 by a multiplicity of fasteners such as 52 in order to form a quasi-toroidal magnetic-flux path around coil 44 that traverses both an external armature 14 and the associated air gap 53. An internal thread 54 is provided for mounting any desired accessory. A concentric spindle cap 55 coaxially supports a micrometer head 56—retained by a set screw 57—with its spindle 58 projecting upward. The micrometer spindle 58 is associated with an attached thimble 59, stationary and rotating scales 60 and 61, respectively, and a lock 62. A radial alignment pin 63 is mounted on the outer surface of the pole piece 49. The electromagnet assembly functions primarily to attract and retain a magnetically soft armature 14 located above the air gap 53 by traversing that armature through the air gap with the symmetrical magnetic field which is generated. This electromagnet assembly is designed to maintain the proper geometric relationship between the hub under test and the operating components of the invention.

Terminals 47 and 48 traverse both spool 45 and the outer pole piece 49. Each terminal is rigidly attached to spool 45 by an internally threaded insulator and associated locknut illustrated at 64 and 65, respectively. Insulator 64 is also externally threaded and together with nut 66 secures spool 45 to the outer pole piece 49. A conductive pigtail 67 connects the respective upper ends of terminals 47 and 48 to opposite ends of coil 44. Finally, nut 68 secures an external conductive lead 69 to terminal 47 in the same manner that external conductive lead 70 is secured to terminal 48.

The electromagnet assembly is designed to simulate the magnetic-flux distribution existing in an armature 7 during actual hub operation. This result is accomplished by arranging the upper surface 71 of the outer pole piece to be accurately flat with inner and outer radiuses similar to those of the pole piece of a disk drive and by arranging the upper surface 72 of the inner pole piece to have the same shape, size, and air gap as that of the permanent magnet on a disk drive. The outer portions of the two pole pieces must be designed with clearance adequate to prevent the abnormally high leakage flux that could otherwise result from using a magnetically soft inner pole piece instead of the permanent magnet employed in a memory-disk drive. In general, the techniques necessary to design the magnetic circuit involve configuring the pole pieces 49 and 51 so that the cross-sectional area normal to the flux path is optimal for efficient operation at a flux level adequate to saturate a specified armature; determining the total reluctance of the magnetic circuit, including the armature, at that particular flux level; and from this information determining the magnetomotive force necessary to produce that flux level. Finally, a coil is constructed to provide the necessary magnetomotive force from the desired excitation without overheating. Because such a design can totally saturate an armature with a flux density considerably exceeding that encountered in actual hub operation, it yields the maximum practical holding force attainable with a realistic flux distribution.

A vertically adjustable spindle assembly is positioned coaxially with the electromagnet assembly and consists principally of a test spindle 73, a spindle spring 74, and a spindle adapter such as 75 or 76 that is interchangeable by removing a retaining screw 77 to accommodate different hub collar designs. An index pin 78 is force fitted into spindle 73 and slides in an appropriate slot in each spindle adapter to prevent inadvertent loosening of retaining screw 77. A polished, hardened spindle ball 79 is forced into the counterbored lower end of test spindle 73 to transmit smoothly adjustable support from the moveable upper surface of micrometer spindle 58. The spindle assembly functions primarily to center a hub assembly relative to the axis of the hub tester and to locate the collar of such a hub at a specified height relative to the upper extremity 71 of outer pole piece 49.

In operation, the reaction of spindle spring 74 against inner pole piece 49 forces the test spindle 73 downward until ball 79 rests on the upper surface of micrometer spindle 58. Consequently, the height of spindle adapter 75 or 76 can be conveniently varied by adjusting micrometer thimble 59 and securing it with the micrometer lock 62.

A proof-ring assembly consists of a flanged cylindrical proof ring 80 appropriately bored and lubricated to slide axially along the outside of pole piece 49 within predetermined limits, a flexible equalizing ring 81 embedded in and bonded to the upper surface of the proof ring 80, a vertical internal slot 82 to engage alignment pin 63 and to thereby prevent rotation of the proof ring 80, breathers 83 and 84 to prevent inadvertently entrapped air from affecting proof-ring operation, and a multiplicity of self-aligning rod couplings, such as 85, rigidly attached to proof ring 80 by means of threads 86 and locknut 87.

Each coupling 85 is mounted coaxially with a corresponding piston rod, such as 32, and rigidly attached to it by threads 88 and locknut 89 at the lower end. The proof-ring assembly functions primarily to transform the total upward force transmitted by all piston rods into a symmetrical circular field and to transmit that field to the outer edge 6 or 13 of a hub that is both centered by a spindle adapter 75 or 76 and electromagnetically retained by a rigidly attached armature 7 or 14. Self-aligning rod couplings such as 85 are commercially available and would normally be employed. A typical coupling of this type can compensate for both angular and lateral misalignment in either tension or compression modes.

Five different primary types of testing operations are possible employing the hub tester according to the present invention. First, operations related to the installation or initial activation of the invention may be performed. Secondly, operations necessary only before testing a new type of hub assembly of the invention may be performed. Thirdly, operations required only when new test parameters are to be employed may be performed; for example, lifting-force adjustment, magnetic-force adjustment, and diaphragm-preload adjustment. Fourthly, repetitious operations essential each time a hub assembly of a given type is to be tested may be performed; for example, general production testing. And fifthly, specific additional miscellaneous testing operations particular to a given workpiece may be performed.

With respect to initial operation and installation of the present invention, leads 69 and 70 are connected to a proper direct-current source having a variable-current capability. Also, couplings 37 and 40 on the manifold assembly are connected by means of a two-position, four-port valve to a gauged, regulated, adjustable pneumatic source.

When it is determined that testing of a particular hub-assembly type is to start, the hub tester is prepared for such a hub assembly. A properly shaped spindle adapter such as 75 is placed on top of the test spindle 73 and rotated to engage the index pin 78. The retaining screw 77 then locks the spindle adapter in place. Next, the relationship between micrometer scales 60 and 61 is adjusted with thimble 59 to locate the spindle adapter 75 at a predetermined nominal distance above the normal operating height. With the electromagnet de-energized and all pistons fully retracted, an appropriate hub assembly such as shown in the figure is placed on the spindle adapter 75. The micrometer thimble 59 is now rotated until armature 7 just contacts the entire upper surface 71 of the outer pole piece 49 and then the micrometer lock 62 is engaged. This describes the adjustment of this hub tester to accept any hub of the given type with the diaphragm 4 in the unloaded mode.

To set new test parameters, the net lifting force required from equalizer 81 can be provided accurately enough for typical applications without additional equipment. For this purpose the air pressure is regulated to equal the required force plus the cumulative weight of the proof-ring assembly and every piston subassembly, all divided by the total bottom area of the pistons. If the critical lifting force is to occur when the proof ring 80 is not in motion, the above result can be refined by adding the small total breakaway force of all piston subassemblies to the numerator.

Similarly, the magnetic holding force required to conduct a given test can also be obtained without additional equipment. With the spindle-adapter height adjusted as previously described, the associated air-pressure regulator is adjusted by means already discussed to yield a net lifting force from equalizer 81 equal to the desired magnetic force plus the weight of an entire hub assembly. Next, the associated current source connected to leads 69 and 70 is turned on, adjusted for magnetic force known experimentally to exceed the required value, and returned to the off condition. With the proof ring 80 retracted by means previously described, the hub assembly is now placed on the spindle adapter 75, and the current source is energized. Then the lifting pressure is applied by controlling the pneumatic pistons. Next, the output of the current source attached to leads 69 and 70 is slowly reduced until the hub assembly is released from the outer pole piece 49. This event can be easily detected from the slight rise of the proof ring 80 which occurs. The magnetic holding force is now properly adjusted. Repetition of the above procedure with different predetermined net lifting forces permits plotting the magnetic holding force as a function of the electromagnet current for a given type of armature.

Next, the diaphragm-preload adjustment requires that the height of the spindle adapter 75 must already be preadjusted as previously described. To permit preloading a diaphragm 4, the micrometer lock 62 is first disengaged, and the thimble 59 is raised in accordance with scales 60 and 61 by the required amount—typically 0.008 inch. The micrometer spindle is then secured at that position with lock 62.

Repetitious general testing operations may be performed with the hub tester according to the present invention prepared in the manner already described. A standard hub-assembly test starts with the proof ring 80 fully retracted in response to lowering of the pneumatic pistons. The current source for the electromagnet is in the off position. A hub of a given type is then placed on the spindle adapter 75 for testing. In general, the net lifting force required at equalizer 81 includes the desired tensile force and the weight of the portion of the hub assembly to be lifted, sometimes excluding the armature as when bonding strength is to be tested, less the diaphragm-preload force, if any. Consecutive test-cycle phases typically include magnetic retention, proof-ring lifting, proof-ring retraction, and magnetic recovery. In the magnetic-retention phase, the current source is switched on and the electromagnet attracts armature 7 downward, possibly with manual assistance. In the lifting phase, the associated control valve causes the pistons to apply lifting force to the hub rim 5 through the piston rods 32, the mechanical couplings 85, and the proof ring 80. The means employed for retaining armature 7 to rim 5 is thereby subjected to the predetermined tensile stress. In the event that such retaining means should fail, excessive upward motion of the proof ring 80 will be arrested by the shock pads 33. In the retraction phase of the test, the control valve for the pistons is moved to the retract position so that the pistons respond by transmitting a predetermined downward force to the proof ring 80 by means of the piston rods 32. Upward force of equalizer 81 upon rim 5 is thereby removed, and the proof ring 80 is retracted downward until arrested by the shock ring 20. The hub assembly under test is now subjected only to magnetic force and to diaphragm force, if any. The electromagnet is then de-energized to initiate the magnetic-recovery phase of the test cycle, thereby removing the downward magnetic force previously exerted on armature 7. At the conclusion of the magnetic-recovery phase, the hub assembly can be removed from the hub tester for inspection. Test failure is indicated by any separation between armature 7 and rim 5 detectable visually, with a thin shim, or by other appropriate means. In the absence of such failure, the hub assembly is considered to be satisfactory.

Other miscellaneous tests may be performed on the hub assembly. For example, the maximum current may be passed through the electromagnet to generate the greatest possible magnetomotive force while the air pressure is increased gradually at the hose coupling 37 to determine the failure force and failure mode of a hub assembly.

Similarly, with a predetermined air pressure applied to the hose coupling 37, the coil current to the electromagnet may be gradually reduced until the proof ring 80 rises to its upper limit. Repetition of this test with different air pressures permits the variation of retaining force with magnetomotive force to be plotted. This information serves as an aid in designing disk-drive retaining magnets and disk-cartridge cover magnets that takes account of the magnetic nonlinearity of the armature 7.

Finally, with proof ring 80 retracted and a hub assembly in place, the electromagnet-coil current may be reduced gradually until the action of diaphragm 4 causes the rim 5 to rise. Because magnetic retaining force on a given type of armature can be determined as a function of coil current as previously described, repetition of this procedure with different spindle-height adjustments permits plotting the diaphragm force as a function of spindle height. Diaphragm force is a critical factor because it both assures hub-assembly alignment on a drive spindle and reduces the effectiveness of disk-assembly retention by a disk-drive magnet, two conflicting effects.

What is claimed is:

1. A magnetic disk-memory-cartridge hub tester comprising:
   a base assembly including a base support member and a vertically actuated motor means,
   means for driving and controlling said motor means,
   an electromagnet and armature assembly having said electromagnet secured to and mounted on said base assembly and including at least one vertically aligned pole piece, said armature being movably mounted for vertical motion, said electromagnet being adapted to traverse said armature vertically towards said pole piece when actuated,
   a spindle assembly mounted on said base assembly and coaxial with the electromagnet assembly to engage said armature and accommodate a lower portion of a hub under test for vertical movement, and
   a proof-ring assembly coupled with the electromagnet assembly to slide axially, vertically in the direction of the spindle along the pole piece of the electromagnet assembly wherein said proof-ring assembly converts the force applied by said motor means into a uniformly distributed force to be applied to the outer edge of said hub under test.

2. The hub tester according to claim 1 in which said electromagnet assembly is coupled with means for varying the power supplied to said electromagnet assembly to generate a variation in magnetic flux density so as to vary the hub retaining force in said tester.

3. The hub tester of claim 1 and further including shock absorbing means connecting said base support member, said motor means and said proof-ring assembly for automatic, pneumatic and mechanical damping to prevent contingent damage in the event of test piece failure.

4. The hub tester of claim 1 in which said electromagnet assembly consists of a coil of insulated conductive wire on an insulating spool having an outer cylindrical pole piece of magnetically soft material rigidly secured to said base and partially surrounding said coil and an inner pole piece concentric with the outer pole piece and constructed of a magnetically soft material and secured to the outer pole piece by a fastening means in order to form a quasi-toroidal magnetic flux path around said coil to traverse an external armature and an associated air gap.

5. The hub tester of claim 4 and further comprising a concentric spindle cap coaxially supporting a micrometer head and associated with said electromagnet assembly for adjustably controlling the dimension of the vertical distance through which said armature moves to cause diaphragm preload.

6. The hub tester of claim 1 and in which said spindle assembly is comprised of a test spindle, a spindle spring and a spindle adapter which is interchangeable to accommodate different hub-collar designs.

7. The hub tester of claim 1 in which said vertically actuated motor means is a plurality of pneumatically actuated piston and cylinder assemblies.

8. The hub tester of claim 7 in which said means for driving and controlling said motor means includes a source of fluid for said pneumatically actuated piston and cylinder assemblies having a manifold assembly supplying fluid to individual cylinders and a supply means connected to said manifold assembly.

9. A magnetic disk-memory-cartridge hub tester comprising,
   a base assembly including a base support member and a vertically pneumatically actuated motor means,
   a source of fluid for said pneumatically actuated motor means including a manifold assembly connected to said motor means,
   an electromagnet and armature assembly having said electromagnet secured to and mounted on said base assembly and including at least one vertically aligned pole piece, said armature being movably mounted for vertical motion, said electromagnet being adapted to traverse said armature vertically towards said pole piece when actuated,
   a spindle assembly mounted on said base assembly and coaxial with the electromagnet assembly to engage said armature and accommodate a lower portion of a hub under test for vertical movement, and
   a proof-ring assembly coupled with the electromagnet assembly to slide axially, vertically in the direction of the spindle along the pole piece of the electromagnet assembly wherein said proof-ring assembly converts the force applied by said motor means into a uniformly distributed force to be applied to the outer edge of said hub under test.

10. The hub tester according to claim 9 in which said electromagnet assembly is coupled with means for varying the power supplied to said electromagnet assembly to generate a variation in magnetic flux density so as to vary the hub-retaining force in said tester.

11. The hub tester of claim 9 and further including shock absorbing means connecting said base support member, said motor means and said proof-ring assembly for automatic, pneumatic and mechanical damping to prevent contingent damage in the event of test piece failure.

12. The hub tester of claim 9 in which said motor means is comprised of four separate vertically oriented pneumatic cylinders connected to a common manifold assembly.

13. The hub tester of claim 12 and further comprising an elastic shock pad mounted on the upper surface of a piston assembly portion of each of said pneumatic cylinders to prevent excessive noise and damaging shock as a result of unrestrained upward piston motion.

14. The hub tester of claim 13 in which each of said pneumatic cylinders is of the double-acting type.

15. The hub tester of claim 9 in which said electromagnet assembly consists of a coil of insulated conductive wire on an insulating spool having an outer cylindrical pole piece of magnetically soft material rigidly secured to said base and partically surrounding said coil and an inner pole piece concentric with the outer pole piece and constructed of a magnetically soft material and secured to the outer pole piece by a fastening means in order to form a quasi-toroidal magnetic flux path around said coil to traverse an external armature and an associated air gap.

16. The hub tester of claim 15 and further comprising a concentric spindle cap coaxially supporting a micrometer head and associated with said electromagnet assembly for adjustably controlling the dimension of the vertical distance through which said armature moves to cause diaphragm preload.

17. The hub tester of claim 9 and in which said spindle assembly is comprised of a test spindle, a spindle spring and a spindle adapter which is interchangeable to accommodate different hub-collar designs.

18. A method of operating a magnetic-disk-memory cartridge hub tester comprising:

a base assembly including a base support member and a vertically actuated motor means, means for driving and controlling said motor means, an electromagnet assembly and armature having said electromagnet secured to and mounted on said base assembly and including at least one vertically aligned pole piece, said armature being movably mounted for vertical motion, said electromagnet being adapted to traverse said armature vertically towards said pole piece when actuated, a spindle assembly mounted on said base engage said armature and assembly and coaxial with the electromagnet assembly to accommodate a lower portion of a hub under test for vertical movement, a proof-ring assembly coupled with the electromagnet assembly to slide axially, vertically in the direction of the spindle along the pole piece of the electromagnet assembly wherein said proof-ring assembly converts the force applied by said motor means into a uniformly distributed force to be applied to the outer edge of said hub under test, and in which said method of operation consists of the steps of:

adjusting said spindle assembly to produce a diaphragm-preload dimension of predetermined known value, adjusting the electronic-current source of said electromagnet to produce a magnetic force of a predetermined known value when later energized, retracting the proof-ring assembly using said motor means, placing a hub assembly on said spindle assembly, energizing said electromagnet, applying a predetermined lifting force on said hub assembly through said proof-ring assembly by means of said motor means, retracting said proof-ring assembly using said motor means, and finally reducing the strength of the electromagnetic field until the hub assembly is released from said electromagnet and examining said hub assembly for failure in order to determine whether or not said hub assembly has satisfactorily withstood said lifting force.

* * * * *